(12) United States Patent
Meng et al.

(10) Patent No.: US 10,026,919 B2
(45) Date of Patent: Jul. 17, 2018

(54) ORGANIC LIGHT-EMITTING DEVICE

(71) Applicant: E Ink Holdings Inc., Hsinchu (TW)

(72) Inventors: Hsin-Fei Meng, Hsinchu (TW);
Sheng-Fu Horng, Hsinchu (TW);
Hsiao-Wen Zan, Hsinchu (TW);
Hao-Wen Chang, Hsinchu (TW);
Cheng-Hang Hsu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/693,445

(22) Filed: Aug. 31, 2017

(65) Prior Publication Data
US 2018/0069188 A1    Mar. 8, 2018

(30) Foreign Application Priority Data
Sep. 7, 2016    (CN) .......................... 2016 1 0804999

(51) Int. Cl.
*H01L 51/54*    (2006.01)
*H01L 51/50*    (2006.01)
*H01L 51/00*    (2006.01)

(52) U.S. Cl.
CPC ...... *H01L 51/5044* (2013.01); *H01L 51/5088* (2013.01); *H01L 51/0037* (2013.01); *H01L 51/5064* (2013.01); *H01L 51/5068* (2013.01)

(58) Field of Classification Search
CPC ............. H01L 51/5044; H01L 51/5064; H01L 51/5068

(Continued)

(56) References Cited

U.S. PATENT DOCUMENTS

| 7,327,081 B2 | 2/2008 | Lo et al. |
| 2004/0185673 A1* | 9/2004 | Ichijo .................. C23C 14/3414 438/758 |

(Continued)

FOREIGN PATENT DOCUMENTS

| TW | 200606234 A | 2/2006 |
| TW | 200720187 A | 6/2007 |
| WO | 2016009958 A1 | 1/2016 |

OTHER PUBLICATIONS

L. S. Liao et al, "High-efficiency tandem organic light-emitting diodes," Applied Physics Letters, vol. 84, No. 2, Jan. 12, 2004.

(Continued)

*Primary Examiner* — George Fourson, III
(74) *Attorney, Agent, or Firm* — CKC & Partners Co., Ltd.

(57) ABSTRACT

An organic light-emitting device includes a first electrode, a first light-emitting layer, a first low work function layer, a second low work function layer, a conductive etching-resistant layer, a first hole-injection layer, a second light-emitting layer, and a second electrode. The first light-emitting layer is disposed over the first electrode. The first low work function layer is disposed over the first light-emitting layer. The second low work function layer is disposed over the first low work function layer, and a work function of the second low work function layer is greater than a work function of the first low work function layer. The conductive etching-resistant layer is disposed over the second low work function layer. The first hole-injection layer is disposed over the conductive etching-resistant layer. The second light-emitting layer is disposed over the first hole-injection layer. The second electrode is disposed over the second light-emitting layer.

12 Claims, 3 Drawing Sheets

(58) Field of Classification Search
USPC .......................................................... 257/89
See application file for complete search history.

(56) References Cited

U.S. PATENT DOCUMENTS

| | | |
|---|---|---|
| 2006/0250079 A1 | 11/2006 | Kwok et al. |
| 2006/0267485 A1 | 11/2006 | Wood et al. |
| 2007/0176161 A1* | 8/2007 | Seo ................. H01L 51/5218 257/13 |
| 2010/0308353 A1 | 12/2010 | Grabowski et al. |
| 2012/0012820 A1* | 1/2012 | Endo ................ H01L 51/5278 257/40 |
| 2013/0134410 A1* | 5/2013 | Kim ................. H01L 51/0039 257/40 |
| 2014/0026964 A1 | 1/2014 | Chittibabu et al. |
| 2015/0053951 A1 | 2/2015 | Riegel et al. |
| 2016/0141542 A1* | 5/2016 | Sun ................. H01L 51/5072 257/40 |
| 2016/0218311 A1* | 7/2016 | Niboshi ............. H01L 51/5084 |
| 2016/0254330 A1* | 9/2016 | Uchida .............. H01L 51/5068 257/40 |
| 2016/0266459 A1* | 9/2016 | Oh ...................... G02F 1/153 |
| 2017/0179435 A1* | 6/2017 | Seo ................... H01L 51/5265 |
| 2017/0213876 A1* | 7/2017 | Ohsawa ............. H01L 27/3213 |
| 2017/0222173 A1* | 8/2017 | Matsusue ........... H01L 51/5016 |
| 2017/0301876 A1* | 10/2017 | Bloom ............... H01L 51/5072 |
| 2017/0338289 A1* | 11/2017 | Seo ................... H01L 27/3211 |

OTHER PUBLICATIONS

Chun-Yu Chen et al, "Continuous blade coating for multi-layer large-area organic light-emitting diode and solar cell," Journal of Applied Physics 110, 094501, 2011.
Corresponding Taiwanese office action dated Feb. 20, 2017.

* cited by examiner

ORGANIC LIGHT-EMITTING DEVICE

RELATED APPLICATIONS

This application claims priority to China Application Serial Number 201610804999.4, filed Sep. 7, 2016, which is herein incorporated by reference.

BACKGROUND

Field of Invention

The present disclosure relates to an organic light-emitting device.

Description of Related Art

An organic light-emitting device (OLED) is a type of self-luminous devices driven by current. OLED displays have a number of technical advantages that liquid crystal displays may not achieve, and are therefore regarded as the mainstream display technology for the next generation. The light-emitting principle of OLEDs relates to applying an external bias voltage, which allows electrons and holes to be transmitted into an organic substance with luminous properties. The electrons and holes are then combined in the organic substance to form excitons. The excitons return to the ground state by way of releasing energy, and light is emitted during the process of releasing energy. Although currently many vendors are devoted to the research and development of OLEDs, however, improving the luminous efficiency of OLEDs is always an objective that the vendors are eager to achieve.

SUMMARY

An organic light-emitting device with a higher luminous efficiency is provided. The organic light-emitting device comprises a first electrode, a first light-emitting layer, a first low work function layer, a second low work function layer, a conductive etching-resistant layer, a first hole-injection layer, a second light-emitting layer, and a second electrode. The first light-emitting layer is disposed over the first electrode. The first low work function layer is disposed over the first light-emitting layer. The second low work function layer is disposed over the first low work function layer. The conductive etching-resistant layer is disposed over the second low work function layer. The first hole-injection layer is disposed over the conductive etching-resistant layer. The second light-emitting layer is disposed over the first hole-injection layer. The second electrode is disposed over the second light-emitting layer. The first low work function layer comprises a lithium compound and second low work function layer comprises an aluminum layer, a silver layer, and/or the like.

In some embodiments, the thickness of the first low work function layer is ranged from about 5 to about 100 Å. The thickness of the second low work function layer is ranged from about 5 to about 200 Å. The thickness of the conductive etching-resistant layer is ranged from about 5 to about 100 Å.

In some embodiments, the conductive etching-resistant layer comprises a material such as for example chrome, titanium, ruthenium, rhodium, palladium, silver, osmium, iridium, platinum, gold, and combinations thereof.

In some embodiments, the first low work function layer comprises a material selected from lithium fluoride or lithium oxide.

In some embodiments, the first hole-injection layer comprises poly (3,4-ethylenedioxythiophene) polystyrene sulfonate (PEDOT:PPS).

In some embodiments, the work function of the second low work function layer is less than 5 eV.

In some embodiments, the organic light-emitting device further comprises a first electron-transport layer and/or a first hole-transport layer, and the first electron-transport layer and the first hole-transport layer directly contact the first light-emitting layer.

In some embodiments, the organic light-emitting device further comprises a second electron-transport layer and/or a second hole-transport layer, and the second electron-transport layer and the second hole-transport layer directly contact the second light-emitting layer.

In some embodiments, a work function of the second low work function layer is greater than a work function of the first low work function layer.

In some embodiments, a thickness of the second low work function layer is greater than a thickness of the first low work function layer.

According to yet some embodiments of the present disclosure, an organic light-emitting device comprises a first electrode, a first light-emitting layer, a first low work function layer, a second low work function layer, a first hole-injection layer, a second light-emitting layer, and a second electrode. The first light-emitting layer is disposed over the first electrode. The first low work function layer is disposed over the first light-emitting layer. The second low work function layer is disposed over the first low work function layer. A work function of the second low work function layer is greater than a work function of the first low work function layer. The first hole-injection layer is disposed over the conductive etching-resistant layer. The first hole-injection layer comprises at least one of carbon nanotubes, nano silver, and nanographene. The second light-emitting layer is disposed over the first hole-injection layer. The second electrode is disposed over the second light-emitting layer.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figures 1, 2:
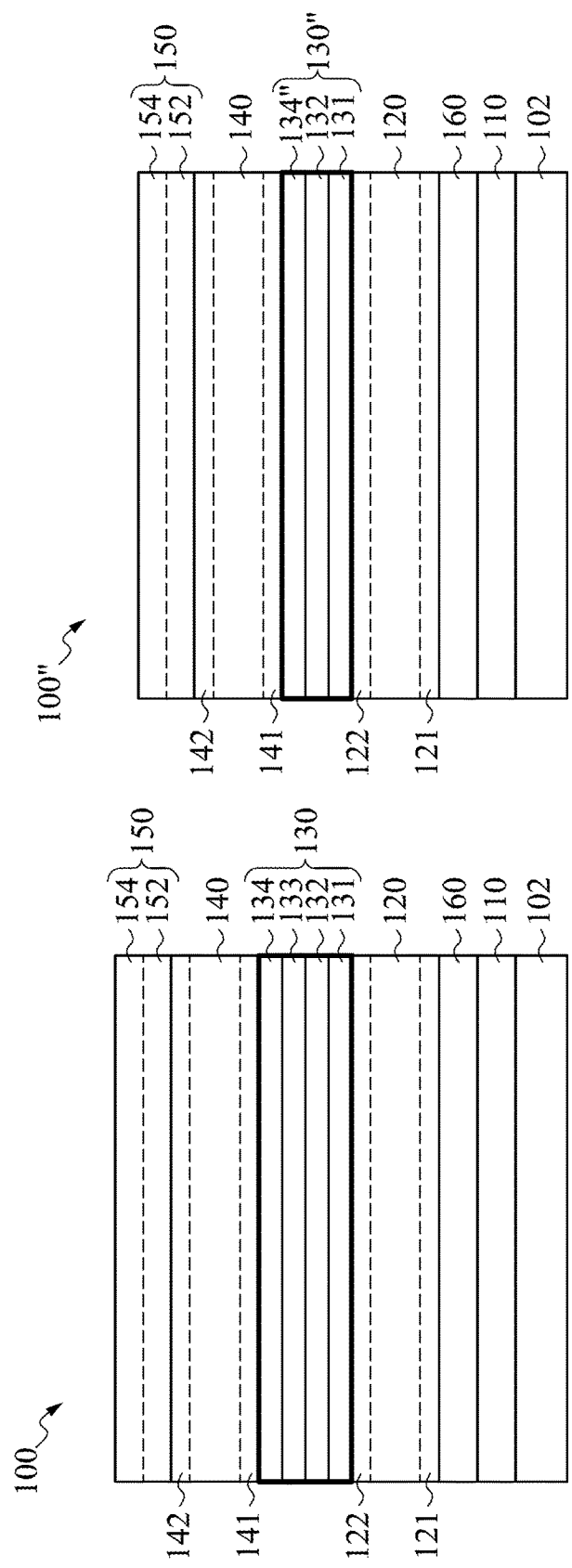
FIG. 1 is a cross-sectional view schematically illustrating an organic light-emitting device according to some embodiments of the present disclosure.
FIG. 2 is a cross-sectional view schematically illustrating an organic light-emitting device according to yet some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view schematically illustrating an organic light-emitting device 100 according to some embodiments of the present disclosure. According to some embodiments of the present disclosure, the organic light-emitting diode 100 includes a first electrode 110, a first light-emitting layer 120, a carrier-generation layer 130, a second light-emitting layer 140, and a second electrode 150.

The first electrode 110 may be, for example, an anode of the organic light-emitting device 100. In some embodiments, the first electrode 110 includes a material having a high work function, such as indium tin oxide, indium zinc oxide, or the like. In some embodiments, the first electrode 110 may be formed on a transparent substrate 102 by various techniques such as physical vapor deposition techniques or chemical vapor deposition techniques.

The first light-emitting layer 120 is disposed over the first electrode 110, and the first light-emitting layer 120 can emit light cure to the combination of electrons and holes therein. Conventional light-emitting materials used in organic light-emitting diodes may be used as the first light-emitting layer 120, which includes (but is not limited to) a red light-emitting material, a green light-emitting material, a blue light-emitting material, an orange light-emitting material, or other light-emitting materials.

The carrier-generation layer 130 is disposed between the first light-emitting layer 120 and the second light-emitting layer 140. According to various embodiments of the present disclosure, the carrier-generation layer 130 includes a first low work function layer 131, a second low work function layer 132, a conductive etching-resistant layer 133, and a first hole-injection layer 134.

The first low work function layer 131 is disposed over the first light-emitting layer 120. In some embodiments, the first low work function layer 131 is made of a light-transparent conductive material, and has a relatively low work function. In some embodiments, the first low work function layer 131 includes a lithium compound, such as lithium fluoride (LiF), lithium oxide (Li2O), and/or the like. In some embodiments, a thickness of the first low work function layer 131 is ranged from about 5 to about 100 angstroms (Å), for example, approximately 8 Å, 16 Å, 30 Å, 50 Å, 80 Å.

The second low work function layer 132 is disposed over the first low work function layer 131, and a work function of the second low work function layer 132 is greater than a work function of the first low work function layer 131. In some embodiments, the work function of the second low work function layer 132 is less than 5 eV. In some embodiments, light emitted from the first light-emitting layer 120 may transmit through the second low work function layer 132. In a number of embodiments, the second low work function layer 132 may be made of a light-transparent conductive material, such as a metal layer with a very thin thickness. For example, the second low work function layer 132 may include an aluminum layer, a silver layer, and/or the like. In some examples, a thickness of the second low work function layer 132 is ranged from about 5 to about 200 Å, for example, approximately 5 Å, 10 Å, 20 Å, 30 Å, 50 Å, 80 Å, 100 Å, 150 Å, or 180 Å. In some embodiments, the second low work function layer 132 directly contacts the first low work function layer 131.

The conductive etching-resistant layer 133 is disposed over the second low work function layer 132. In various embodiments, a conductivity of the conductive etching-resistant layer 133 is close to that of metal, and the conductive etching-resistant layer 133 can at least resist etching or erosion from an acid. In some embodiments, the conductive etching-resistant layer 133 includes chrome, such as for example a chrome metal, a chrome compound (for example, chrome carbide), and a chrome alloy. In yet some embodiments, the conductive etching-resistant layer 133 includes titanium, ruthenium, rhodium, palladium, silver, osmium, iridium, platinum, gold, an alloy thereof, or a compound thereof. In some embodiments, the conductive etching-resistant layer 133 is metal layer with a very thin thickness so that light emitted from the first light-emitting layer 120 or the second light-emitting layer 140 may transmit through the conductive etching-resistant layer 133. In examples, the thickness of the conductive etching-resistant layer 133 is ranged from about 5 to about 100 Å, for example approximately 5 Å, 10 Å, 20 Å, 30 Å, 50 Å, 80 Å. In some embodiments, the conductive etching-resistant layer 133 directly contacts the second low work function layer 132.

The first hole-injection layer 134 is disposed over the conductive etching-resistant layer 133. Any conventional hole-injection material known in the art may be used as the material of the first hole-injection layer 134 in the embodiments of the present embodiment. In some embodiments, the first hole-injection layer 134 includes poly (3,4-ethylenedioxythiophene) polystyrene sulfonate (PEDOT:PPS). In some embodiments, a PEDOT:PPS solution is first coated on the conductive etching-resistant layer 133, and then a thermal process is performed to form a hardened PEDOT:PPS film that serves as the first hole-injection layer 134. According to some embodiments of the present disclosure, the objective of disposing the conductive etching-resistant layer 133 is to avoid that an acidic solvent of the PEDOT:PPS solution erodes the second low work function layer 132 there under. As a result, the situation which the second low work function layer 132 is damaged or fails may be prevented. In compared examples, the carrier-generation layer 130 did not include the conductive etching-resistant layer 133, and the PEDOT:PPS solution was coated on the second low work function layer 132. The experiment results showed that the obtained organic light-emitting devices had abnormally high electric resistance and reliability of the devices was deteriorated considerably. It is found from much research and analysis that the acidic solvent in the PEDOT:PPS solution may erode the second low work function layer 132 underneath, thus causing the resistance value to abnormally increase. Hence, according to some embodiments of the present disclosure, one of the technical features is disposing the conductive etching-resistant layer 133 in the carrier-generation layer 130, and the conductive etching-resistant layer 133 being disposed between the second low work function layer 132 and the first hole-injection layer 134. In some embodiments, a thickness of the first hole-injection layer 134 is ranged from about 20 to about 100 nm, for example about 30 nm, 50 nm, 70 nm or 90 nm. In other embodiments, the first hole-injection layer 134 may include other conventional hole-injection material such as for example copper phthalocyanine (CuPc).

The second light-emitting layer 140 is disposed over the first hole-injection layer 134, and the first light-emitting layer 120 can emit light due to the combination of electrons and holes therein. Any conventional light-emitting material used in organic light-emitting diodes may be used as the material of the first light-emitting layer 120, which includes (but is not limited to) a red light-emitting material, a green light-emitting material, a blue light-emitting material, an orange light-emitting material, or other light-emitting materials. In embodiments, since the material of the second light-emitting layer 140 is different from that of the first light-emitting layer 120, the second light-emitting layer 140 and the first light-emitting layer 120 emit lights with different colors (i.e., different spectra) to allow the organic light-emitting device 100 to have at least two different main wavelengths.

The second electrode 150 is disposed over the second light-emitting layer 140. The second electrode 150 may be, for example, a cathode of the organic light-emitting device 100. In some embodiments, the second electrode 150 includes a lithium fluoride layer 152 and an aluminum layer 154. Any cathode material suitable for organic light-emitting diodes may be used as the material of the second electrode 150 in embodiments of the present disclosure. For example, the second electrode 150 may include a silver-magnesium alloy layer.

The carrier-generation layer 130 interconnects the first light-emitting layer 120 with the second light-emitting layer 140. The first low work function layer 131 and the second low work function layer 132 of the carrier-generation layer 130 may facilitate to provide or transmit electrons to the first light-emitting layer 120 so as to facilitate light emitting of the first light-emitting layer 120. In addition, the first hole-injection layer 134 of the carrier-generation layer 130 is helpful in providing or transmitting holes to the second light-emitting layer 140 so as to facilitate light emitting of the second light-emitting layer 140. The conductive etching-resistant layer 133 is disposed between the first hole-injection layer 134 and the second low work function layer 132. Not only can the conductive etching-resistant layer 133 protect the second low work function layer 132 there under, but the conductive etching-resistant layer 133 also has a function of current transmission.

Although only two light-emitting layers, i.e., the first light-emitting layer 120 and the second light-emitting layer 140, are depicted in FIG. 1, the organic light-emitting device 100 may include an extra light-emitting layer and carrier-generation layer according to other embodiments of the present disclosure. For example, another carrier-generation layer and another light-emitting layer may be added between the second light-emitting layer 140 and the second electrode 150. The added carrier-generation layer may be disposed between the second light-emitting layer 140 and the added light-emitting layer.

According to various embodiments of the present disclosure, the organic light-emitting device 100 has a plurality of light-emitting layers therein. These light-emitting layers are connected in series so that a single current density may simultaneously drive the plurality of light-emitting layers. As a result, a relatively higher luminous efficiency is obtained according to the embodiments of the present disclosure.

In some embodiments, the organic light-emitting device 100 further includes a first hole-transport layer 121 and/or a first electron-transport layer 122. As shown in FIG. 1, the first hole-transport layer 121 and the first electron-transport layer 122 are in contact with the first light-emitting layer 120. In yet some embodiments, the organic light-emitting device 100 further includes a second hole-transport layer 141 and/or a second electron-transport layer 142, and the second hole-transport layer 141 and/or the second electron-transport layer 142 are in contact with the second light-emitting layer 140.

In some embodiments, the organic light-emitting device 100 further includes a second hole-injection layer 160. The second hole-injection layer 160 is disposed between the first electrode 110 and the first light-emitting layer 120. In some embodiments, the second hole-injection layer 160 and the first hole-injection layer 134 include the same material. In yet some embodiments, the second hole-injection layer 160 and the first hole-injection layer 134 include different materials.

FIG. 2 is a cross-sectional view schematically illustrating an organic light-emitting device 100" according to yet some embodiments of the present disclosure. The same reference numbers are used in FIG. 2 to refer to the same or like elements. The structure of the organic light-emitting device 100" depicted in FIG. 2 is similar to that of the organic light-emitting device 100 depicted in FIG. 1, but there are two differences there between. The first difference is that carrier-generation layer 130" does not include the conductive etching-resistant layer 133. The second difference is that first hole-injection layer 134" includes a nano-conductive material. For example, the first hole-injection layer 134" may include carbon nanotubes, nano silver, nanographene, or combinations thereof. In the embodiment that the first hole-injection layer 134" includes the nano-conductive material, the turn-on light-emitting voltage of the organic light-emitting device 100" can be further decreased because the conductivity of the nano-conductive material is greater than that of the conventional organic conductive material. In addition, in various embodiments, a nano-conductive material layer may be formed by utilizing a neutral solvent, such as ethanol, or a medium without acidic solvent. Therefore, the second low work function layer 132 is not damaged during the manufacturing process and there is no need to additionally dispose the conductive etching-resistant layer 133.

Figure 4:
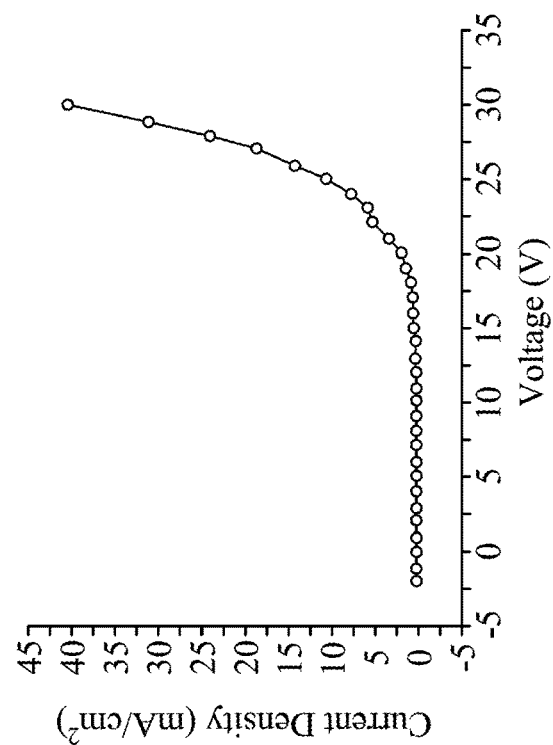
FIG. 4 depicts a current density-voltage curve of the organic light-emitting device associated with FIG. 3.
Figure 3:
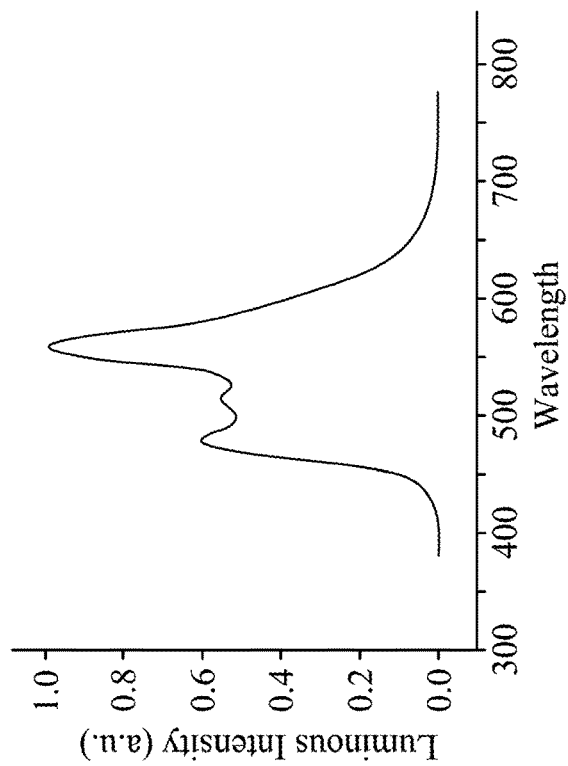
FIG. 3 depicts a light-emitting spectrum of an organic light-emitting device according to one embodiment of the present disclosure.
Figure 5:
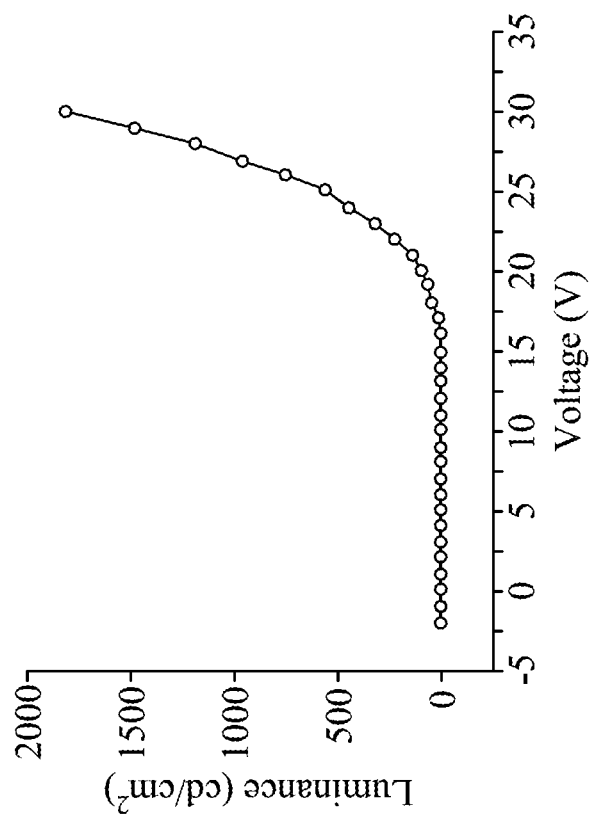
FIG. 5 depicts a luminance-voltage curve of the organic light-emitting device associated with FIG. 3.

FIG. 3 is diagram showing a light-emitting spectrum of an organic light-emitting device according to one embodiment of the present disclosure. In this embodiment, the first light-emitting layer is a material layer capable of emitting an orange light with a main wavelength of 560 nm. The second light-emitting layer is a material layer capable of emitting a blue light with a main wavelength of 480 nm. FIG. 3 shows the result that both the first light-emitting layer and the second light-emitting layer can emit light. FIG. 4 is diagram showing a current density-voltage curve of the organic light-emitting device associated with FIG. 3. FIG. 5 is diagram showing a luminance-voltage curve of the organic light-emitting device associated with FIG. 3. The results of FIG. 4 and FIG. 5 show that a turn-on voltage of the organic light-emitting device is between about 20 and about 25 volts according to the present embodiment.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present disclosure cover modifications and variations of the present disclosure provided they fall within the scope of the following claims and their equivalents.

What is claimed is:

1. An organic light-emitting device comprising:
   a first electrode;
   a first light-emitting layer disposed over the first electrode;
   a first low work function layer disposed over the first light-emitting layer;
   a second low work function layer disposed over the first low work function layer;
   a first hole-injection layer disposed over the second low work function layer;
   a conductive etching-resistant layer disposed between the second low work function layer and the first hole-injection layer;
   a second light-emitting layer disposed over the first hole-injection layer; and
   a second electrode disposed over the second light-emitting layer;
   wherein the first low work function layer comprises a lithium compound and second low work function layer comprises a light-transparent conductive material.

2. The organic light-emitting device of claim 1, wherein the first low work function layer has a thickness ranged from about 5 Å to about 100 Å, the second low work function layer has a thickness ranged from about 5 Å to about 200 Å.

3. The organic light-emitting device of claim 1, wherein the conductive etching-resistant layer comprises a material selected from the group consisting of chrome, titanium, ruthenium, rhodium, palladium, silver, osmium, iridium, platinum, gold, and a combination thereof.

4. The organic light-emitting device of claim 1, wherein the first low work function layer comprises a material selected from lithium fluoride or lithium oxide.

5. The organic light-emitting device of claim 1, wherein the second low work function layer comprises an aluminum or a silver layer.

6. The organic light-emitting device of claim 1, wherein the first hole-injection layer comprises poly (3, 4-ethylenedioxythiophene) polystyrene sulfonate (PEDOT:PPS).

7. The organic light-emitting device of claim 1, wherein the second low work function layer has a work function of less than 5 eV.

8. The organic light-emitting device of claim 1, further comprising a first electron-transport layer and a first hole-transport layer, and the first electron-transport layer and the first hole-transport layer are in contact with the first light-emitting layer.

9. The organic light-emitting device of claim 1, further comprising a second electron-transport layer and a second hole-transport layer, and the second electron-transport layer and the second hole-transport layer are in contact with the second light-emitting layer.

10. An organic light-emitting device comprising:
    a first electrode;
    a first light-emitting layer disposed over the first electrode;
    a first low work function layer disposed over the first light-emitting layer;
    a second low work function layer disposed over the first low work function layer;
    a first hole-injection layer disposed over the second low work function layer, wherein the first hole-injection layer comprises at least one of carbon nanotubes, nano silver, and nanographene;
    a second light-emitting layer disposed over the first hole-injection layer; and
    a second electrode disposed over the second light-emitting layer;
    wherein the first low work function layer comprises a lithium compound and second low work function layer comprises a light-transparent conductive material.

11. The organic light-emitting device of claim 1, wherein a work function of the second low work function layer is greater than a work function of the first low work function layer.

12. The organic light-emitting device of claim 1, wherein a thickness of the second low work function layer is greater than a thickness of the first low work function layer.

* * * * *